(12) United States Patent
Hamilton, Jr. et al.

(10) Patent No.: US 6,828,545 B1
(45) Date of Patent: Dec. 7, 2004

(54) HYBRID MICROELECTRONIC ARRAY STRUCTURE HAVING ELECTRICALLY ISOLATED SUPPORTED ISLANDS, AND ITS FABRICATION

(75) Inventors: William J. Hamilton, Jr., Ventura, CA (US); Eli E. Gordon, Goleta, CA (US); Ronald W. Berry, Goleta, CA (US)

(73) Assignee: Raytheon Company, Waltham, MA (US)

(*) Notice: Subject to any disclaimer, the term of this patent is extended or adjusted under 35 U.S.C. 154(b) by 77 days.

(21) Appl. No.: 09/859,575

(22) Filed: May 15, 2001

(51) Int. Cl.[7] .............................................. H01L 31/00
(52) U.S. Cl. ............................. 250/214.1; 250/208.1; 257/444; 257/457
(58) Field of Search .......................... 250/208.1, 208.2, 250/214.1; 257/443, 444, 457, 459, 737, 738

(56) References Cited

U.S. PATENT DOCUMENTS

| | | | | |
|---|---|---|---|---|
| 5,591,959 A | * | 1/1997 | Cigna et al. | 250/208.1 |
| 5,621,225 A | * | 4/1997 | Shieh et al. | 257/81 |
| 5,742,044 A | * | 4/1998 | Battersby | 250/208.1 |
| 6,157,042 A | * | 12/2000 | Dodd | 257/21 |
| 6,262,408 B1 | * | 7/2001 | Izumi et al. | 250/208.1 |
| 6,388,256 B1 | * | 5/2002 | Watton et al. | 250/338.4 |
| 6,458,547 B1 | * | 10/2002 | Bryan et al. | 435/7.1 |

FOREIGN PATENT DOCUMENTS

JP   06-037291   * 10/1994

* cited by examiner

*Primary Examiner*—Thanh X. Luu
*Assistant Examiner*—Stephen Yam
(74) *Attorney, Agent, or Firm*—William C. Schubert

(57) ABSTRACT

A hybrid microelectronic array structure is fabricated from a readout integrated circuit array of microelectronic integrated circuits and a supported array of supported islands. The supported islands include one or more supported elements, with a respective supported element for each of the readout integrated circuits. The supported array is made by depositing the first semiconductor region onto a supported substrate and depositing the second semiconductor region onto the first semiconductor region, and defining supported islands as electrically isolated segments. On each supported element, a first interconnect is formed to the first semiconductor region and a second interconnect is formed to the second semiconductor region. The supported array is joined to the readout integrated circuit array by an interconnect structure, preferably a bump interconnect structure, to form the hybrid microelectronic array structure, with each readout integrated electrically interconnected to the respective one of the supported elements.

23 Claims, 4 Drawing Sheets

HYBRID MICROELECTRONIC ARRAY STRUCTURE HAVING ELECTRICALLY ISOLATED SUPPORTED ISLANDS, AND ITS FABRICATION

This invention was made with government support under contract No. N66001-98-C-8622 awarded by the Department of the Navy. The government has certain rights in this invention.

This invention relates to a hybrid microelectronic array structure in which a supported array is joined to a microelectronic integrated circuit and, more particularly, to such a hybrid microelectronic array structure wherein the supported array is segmented.

BACKGROUND OF THE INVENTION

Many imaging sensor systems utilize an optical system to focus the infrared or visible-light energy of a scene onto a detector array. One widely used detector array is the focal plane array (FPA), in which an array of detector elements is positioned at the focal plane of the optical system. The infrared or visible-light energy focused onto the detector elements is converted to electrical signals. The electrical signals responsive to the image are viewed on a display or processed by a computer, as for example with pattern recognition techniques.

The most sensitive FPA detector arrays are hybrid structures that use an optimized detector array and an optimized readout integrated circuit. The detector elements of the detector array are arranged to define pixels of an image and convert the incident infrared or visible-light energy to output electrical signals. The respective readout integrated circuits amplify and condition the electrical signals for subsequent use. The hybrid microelectronic array structures are typically cooled, as to about liquid nitrogen temperature, to further improve the signal-to-noise ratios of the output electrical signals.

Hybrid microelectronic array structures of several types are available and are widely used in focal plane arrays. However, the present inventors have recognized that available hybrid microelectronic array structures have limitations on their geometries and performance. Certain geometries of imaging sensor systems that would otherwise be highly advantageous cannot be made with available hybrid microelectronic array structures. Resolution, radiation hardness, reliability in the thermal cycling environment, and other properties of the available hybrid microelectronic array structures may be improved.

There is therefore a need for an improved hybrid microelectronic array structure. The present invention fulfills this need, and further provides related advantages.

SUMMARY OF INVENTION

The present invention provides a hybrid microelectronic array structure and a method for its fabrication. This approach yields improved electrical and thermomechanical performance of the hybrid microelectronic array structure by isolating the adjacent detector elements of the array. Electrical and thermomechanical interactions between adjacent detector elements are thereby reduced. Reduction of the electrical interactions results in improved electrical performance of the hybrid microelectronic array structure such as reduced crosstalk between the detector elements of adjacent pixels. Reduction of thermomechanical interactions results in greater mechanical reliability and reduced risk of failures when the hybrid microelectronic array structure is repeatedly thermally cycled by cooling to its operating temperature and later returning to ambient temperature. The hybrid microelectronic array structure may be made in either planar or curved forms, with the curved form leading to improved performance and increased compactness in several types of sensor systems.

In accordance with the invention, a hybrid microelectronic array structure comprises a microelectronic integrated circuit array comprising an array of microelectronic integrated circuits, with each of the microelectronic integrated circuits comprising a first supported-structure interconnect location and a second supported-structure interconnect location. The hybrid microelectronic array structure further comprises a supported array comprising an array of supported islands with each supported island having at least one supported element therein. There is at least one supported element for each of the microelectronic integrated circuits. Each of the supported islands comprises a first region and a second region, and each of the supported islands is electrically isolated from each of the other supported islands except through the microelectronic integrated circuit array. (There may be electrical communication through the circuitry of the microelectronic integrated circuit array.) Each of the two regions is preferably a semiconductor region. An interconnect structure extends between each of the microelectronic integrated circuits and its respective supported element. Each interconnect structure comprises a first interconnect extending from the first supported-structure interconnect location of each of the microelectronic integrated circuits to the first region of its respective supported element, and a second interconnect extending from the second supported-structure interconnect location of each of the microelectronic integrated circuits to the second region of its respective supported element. The interconnects are preferably bump interconnects comprising a deformable, electrically conductive material such as indium. The bump interconnects also serve as the mechanical supports to support the supported elements and supported islands from the respective microelectronic integrated circuits.

In a typical case, each microelectronic integrated circuit comprises an electrical interface circuit, and each supported element comprises an input/output element supported on the electrical interface circuit. In the most preferred embodiment, the electrical interface circuit is a readout integrated circuit, and the input/output element is a detector such as a light detector. In another embodiment, the electrical interface circuit is a driver integrated circuit, and the input/output element is an emitter such as a light emitter.

In the preferred application wherein the supported element is a light detector, the first semiconductor region of each of the supported islands is an n-doped semiconductor, and the second semiconductor region of each of the supported elements is a p-doped semiconductor (or they may be reversed). The detector elements may be sensitive to infrared radiation, or to visible light, ultraviolet light, X-rays, or other wavelengths, according to the materials of construction. Examples of operable detectors include mercury-cadmium-telluride diodes, indium antimonide diodes, quantum well infrared photodetectors (QWIP), and extrinsic impurity band conductor (IBC) material in silicon or germanium.

In one form, the microelectronic integrated circuit array and the supported array are each substantially planar. In another embodiment made possible by the mechanically isolated nature of the supported elements, the microelectronic integrated circuit array and the supported array are each curved. This arrangement permits the construction of focal curved arrays, which in turn are advantageously employed in certain sensor systems. The sensor systems using curved detector arrays may be made more compact and more accurate over a wide angular range than those using flat-plane detector arrays.

A method of fabricating a hybrid microelectronic array structure as applied to detectors comprises the steps of providing a readout integrated circuit array comprising an array of readout integrated circuits, with each of the readout integrated circuits comprising a first detector interconnect location and a second detector interconnect location. A detector array comprising an array of detector islands is prepared. There is a respective detector element for each of the readout integrated circuits. Each of the detector islands comprises a first semiconductor region and a second semiconductor region. The step of providing a detector array includes the steps of depositing the first semiconductor region onto a detector substrate and depositing the second semiconductor region onto the first semiconductor region. Detector islands are defined as electrically isolated islands, each detector island including a segment of the first semiconductor region overlying the detector substrate, and the second semiconductor region overlying the first semiconductor region. The method includes forming on each detector element a first interconnect to the first semiconductor region and a second interconnect to the second semiconductor region. The detector array is joined to the readout integrated circuit array by an interconnect structure to form the hybrid microelectronic array structure, with each readout integrated electrically interconnected to the respective one of the detector elements. The step of joining includes the steps of joining each first interconnect to the respective first detector interconnect location, and joining each second interconnect to the respective second detector interconnect location. There may be an electrically nonconducting support material lying between the readout integrated circuit array and the detector array. The same approach may be used for other hybrid microelectronic array structures.

In a conventional hybrid microelectronic array structure, the detector elements of the detector arrays have a common mechanical interconnection through their electrically nonconducting detector substrate and a common electrical interconnection through one or more of the electrically conducting active layers. The electrical interconnections are avoided with the present approach. The only mechanical interconnection between the detector islands, other than through the readout integrated circuit array, is through an optional support material that does not carry substantial forces, and therefore the detector elements may be described as being substantially mechanically isolated. The substantial absence of the mechanical interconnection between adjacent detector elements reduces the development of differential thermal stresses due to the differential thermal expansions of the components experienced when the temperature of the hybrid microelectronic array structure changes. The substantial absence of the mechanical interconnection also permits the hybrid microelectronic array structure to be fabricated and then bent or otherwise deformed into nonplanar, curved shapes, such as a segment of a cylinder or a segment of a sphere. The shaped hybrid microelectronic array structure may be conformed to the curved focal surface of a conformably designed sensor system. The absence of the electrical interconnection between adjacent detector elements reduces electrical crosstalk, improves resolution of the image, and reduces susceptibility to radiation damage of the detector array.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment

DETAILED DESCRIPTION OF THE INVENTION

Figure 1:
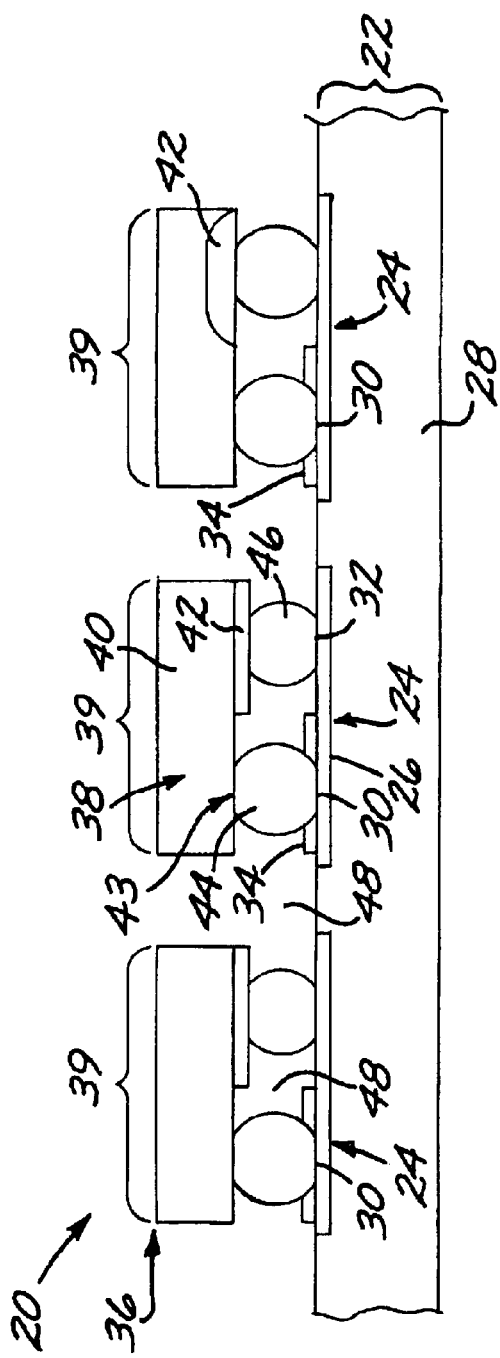
FIG. 1 is a schematic elevational view of a hybrid microelectronic array structure according to the invention.
Figures 10, 11:
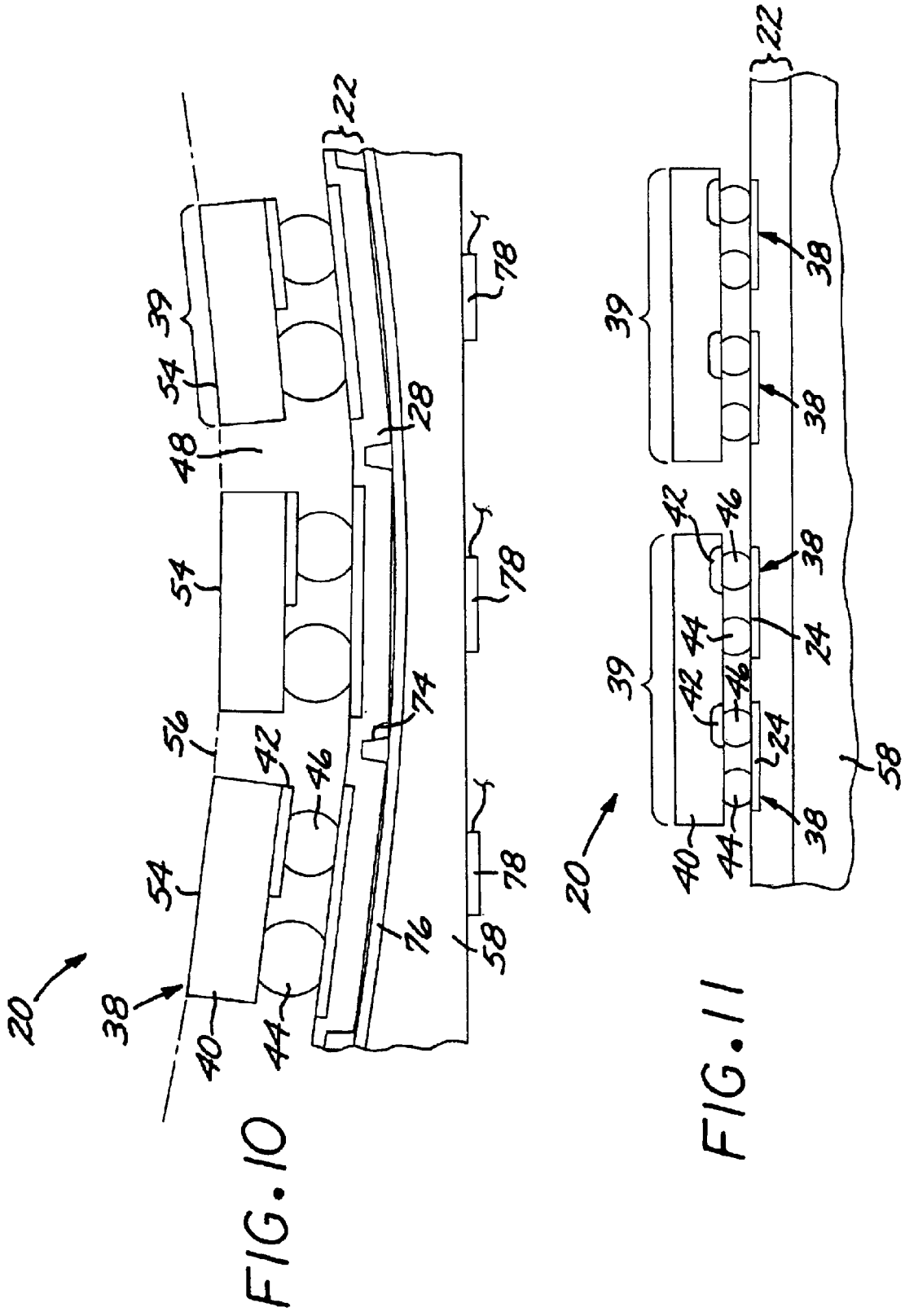
FIG. 10 is a schematic elevational view of a curved hybrid microelectronic array structure.
FIG. 11 is a schematic elevational view of a hybrid microelectronic array structure with multiple detector elements in each detector island.

FIG. 1 depicts a hybrid microelectronic array structure 20. The hybrid microelectronic array structure 20 is described and illustrated in terms of its most preferred form of a detector structure, with references to alternative structures. The hybrid microelectronic array structure 20 comprises a readout integrated circuit array 22 including an array of readout integrated circuits (ROICs) 24. Each of the readout integrated circuits 24 has a microelectronic circuit region 26 supported on a common ROIC substrate 28. On each of the readout integrated circuits 24 there is a first detector interconnect location 30 (i.e., first supported-structure interconnect location) and a second detector interconnect location 32 (i.e., second supported-structure interconnect location). Optionally and as illustrated, all of the first detector interconnect locations 30 are commonly connected together by a electrical conductor connection trace 34 so that they are in electrical communication The hybrid microelectronic array structure 20 further includes a detector array 36 comprising an array of individual detector elements 38 arranged as detector islands 39. (FIG. 1 illustrates the case where there is one detector element 38 per detector island 39, and FIG. 11 illustrates the case where there is more than one detector element 38 per detector island 39.) There is a respective detector element 38 for each of the readout integrated circuits 24. Each respective pair of detector element 38 and readout integrated circuit 24 defines a unit cell or pixel of the hybrid microelectronic array structure 20. Each of the detector elements 38 comprises a first region, preferably a first semiconductor region 40, and a second region, preferably a second semiconductor region 42. In a preferred case the first semiconductor region 40 of each of the detector islands 39 is an n-doped semiconductor, and the second semiconductor region 42 of each of the detector islands 39 is a p-doped semiconductor. The regions may be any operable form, and two approaches are illustrated. In the leftmost and center detector elements 38 of FIG. 1, the second semiconductor region 42 is a distinct layer. In the rightmost detector element 38 of FIG. 1, the second semiconductor region 42 is a doped region in the first semiconductor region 40. In each case, the second semiconductor region 42 overlies the first semiconductor region 40, and vice versa.

More generally, the detector islands 39 are input/output elements that are supported islands and the detector elements 38 are supported elements. These structures are supported from the respective readout integrated circuits 24. The readout integrated circuits 24 serve as microelectronic integrated circuits.

The first semiconductor region 40 of each of the detector islands 39 is physically discontinuous from the first semiconductor region 40 of each of the other detector islands 39. The second semiconductor region 42 of each of the detector islands 39 is physically discontinuous from the second semiconductor region 42 of each of the other detector islands 39. Stated alternatively, each of the detector islands 39 is electrically isolated from each of the other detector islands 39 except through the readout integrated circuit array 22.

An interconnect structure 43 extends between each of the readout integrated circuits 24 and its respective detector element 38. The interconnect structure 43 thus serves as a supported-structure interconnect structure. The interconnect structure 43 is preferably a bump interconnect structure. Each such bump interconnect structure 43 comprises a first bump interconnect 44 from the first detector interconnect location 30 of each of the readout integrated circuits 24 to the first semiconductor region 40 of its respective detector element 38. A second bump interconnect 46 extends from the second detector interconnect location 32 of each of the readout integrated circuits 24 to the second semiconductor region 42 of its respective detector element 38. The bump interconnects also serve as the mechanical supports to support the detector elements 38 and detector islands from the respective readout integrated circuits 24. The first bump interconnect 44 and the second bump interconnect 46 each preferably are made of the element indium (including indium and indium alloys), but other types of bump interconnects may be used as well. Examples of such other types of bump interconnects include a reflowing solder, an electrically conductive polymer, and an electrically conductive adhesive. The use of bump interconnects is well known in the art for other applications.

The semiconductor regions 40 and 42 that define each detector element 38 are supported from their respective readout integrated circuits 24 by the bump interconnects 44 and 46. Optionally, to increase the mechanical stability of the detector elements 38, an electrically nonconducting support material 48 may be present between the readout integrated circuit array 22 and the detector array 36. This electrically nonconducting support material 48 is typically a soft material such as a soft epoxy or latex polymer or a wax that provides lateral stability to the bump interconnects 44 and 46 but does not transmit substantial shear forces that arise from differences in thermal expansion coefficient between the detector array 36 and the readout integrated circuit 24. The electrically nonconducting support material 48 may be provided during processing to provide mechanical stability during processing operations, and then may be left in place or, preferably, removed at a later time. The electrically nonconducting support material 48 provides lateral support for the detector elements 38 but does not transmit substantial stresses that might otherwise build up between the detector elements.

Thus, the detector islands 39 are mechanically not connected together except through the interconnect structure 43 to the readout interconnect array 22 and through the optional support material 48, which does not carry or support any substantial load in service. The detector array 36 is therefore resistant to the buildup of thermal stresses during thermal cycling between ambient temperature and the cryogenic service temperature. The detector islands 39 are not electrically connected together directly through either of the semiconductor regions 40 and 42. Electrical cross talk between the different detector islands 39 is thereby avoided Electrical current flows though the interconnection traces 34 may be readily controlled by the circuitry (not shown) in the readouts of the peripheral unit cell.

The readout integrated circuit 24 is preferably a silicon-based integrated circuit for optimal cryogenic electrical performance. The detector element 38 is preferably an operable type such as a p-doped/n-doped mercury-cadmium-telluride diode, a p-doped/n-doped indium antimonide diode, a quantum well infrared photodetector (QWIP), or an extrinsic impurity band conductor (IBC) material in silicon or germanium, but is not so limited.

The readout integrated circuits 24 are more generally described as microelectronic integrated circuit elements. They may function as an electrical interface circuit of an input/output device, with an input/output element supported on the electrical interface circuit as the supported element. In the preferred structure described herein, the electrical interface circuit is the readout integrated circuit 24, and the supported element that is supported on the readout integrated circuit 24 is the detector element 38. In an alternative that is also within the scope of the present approach, the electrical interface circuit is a driver integrated circuit, and the supported element is an emitter such as a light-emitting diode or a laser such as a laser diode. Thus, the supported elements may be described as input/output elements, because they may provide input (as in the case of a detector) or output (as in the case of an emitter) relative to the hybrid microelectronic array structure. Each driver integrated circuit may drive one or more emitters. Each driver integrated circuit provides the driving command and energy for its emitter or emitters. The microelectronic integrated circuit elements may be of other types as well. The present disclosure is applicable to all of these other circuit types such as the emitter and the other types, with appropriate modifications to the descriptions.

The hybrid microelectronic array structure 20 is depicted in FIG. 1 as having two semiconductor layers 40 and 42 for each detector island 39, with respective bump interconnects 44 and 46. It may have additional layers and an additional respective bump interconnect for each additional layer, for each detector island 39. The detector islands 39 remain isolated from each other as described. Thus, the hybrid microelectronic array structure has at least two semiconductor layers and a respective bump interconnect for each layer, for each detector island.

Figure 2:
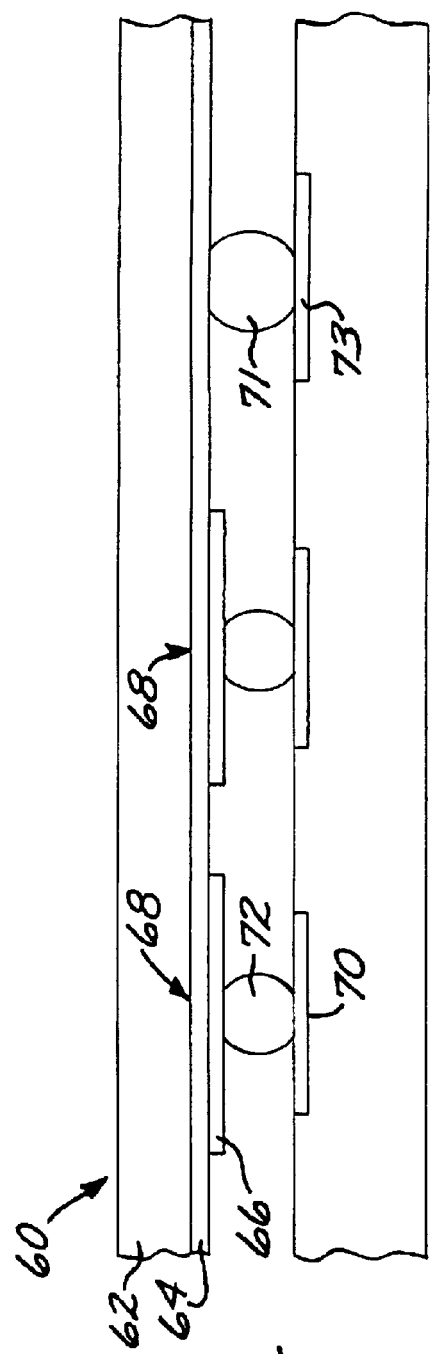
FIG. 2 is a schematic elevational view of a conventional hybrid microelectronic array structure.

The present approach depicted in FIG. 1 is distinct from the conventional approach to a hybrid microelectronic array structure as illustrated in FIG. 2. In this case, there are no electrically isolated, discontinuous detector islands. A detector array 60 includes a continuous detector substrate 62 upon which are deposited a continuous, electrically common first semiconductor layer 64 and a discontinuous segmented second semiconductor layer 66. (In some embodiments, the substrate 62 and layer 64 are combined, but in any event are continuous.) The second semiconductor layer 66 of each detector element 68 is connected to its respective readout integrated circuit 70 by a single bump interconnect 72. There is a common bump interconnect 71 for first semiconductor layer 64, to a common trace 73. The substrate 62 is a direct mechanical connection between each detector element 68 that allows the accumulation of mechanical stress resulting from the differences in the coefficients of thermal expansion during thermal cycling. The first semiconductor layer 64 is a direct electrical connection between each detector element 68 that allows detrimental electrical crosstalk between adjacent detector elements 68.

Figure 3:
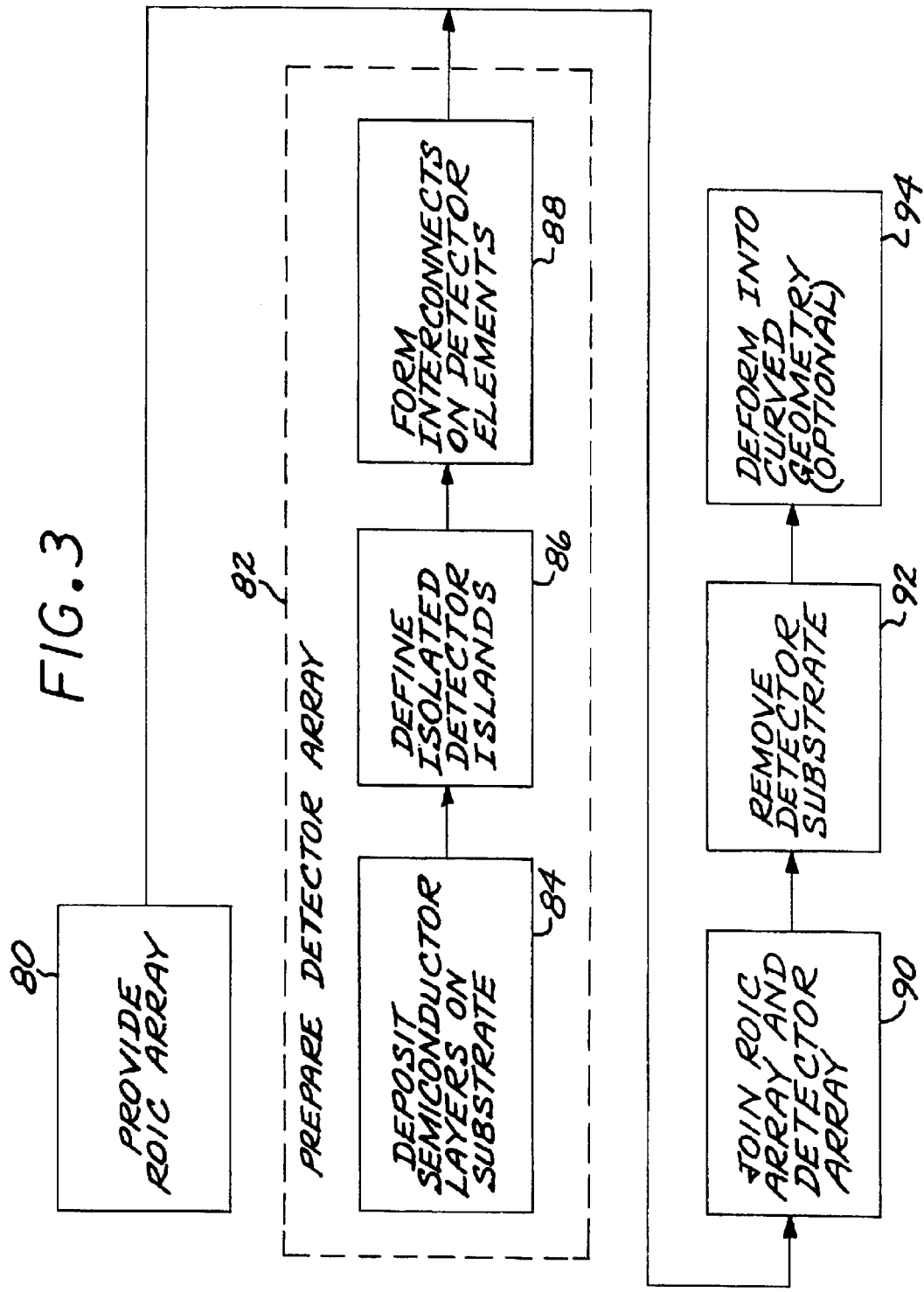
FIG. 3 is a block flow diagram of an approach for fabricating the hybrid microelectronic array structure.
Figure 8:
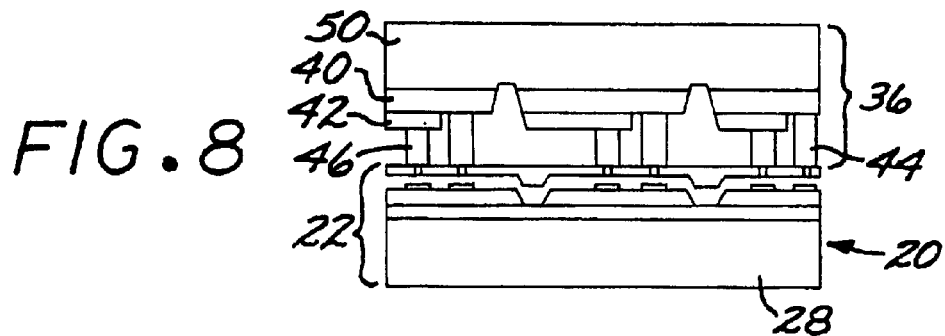
Figure 9:
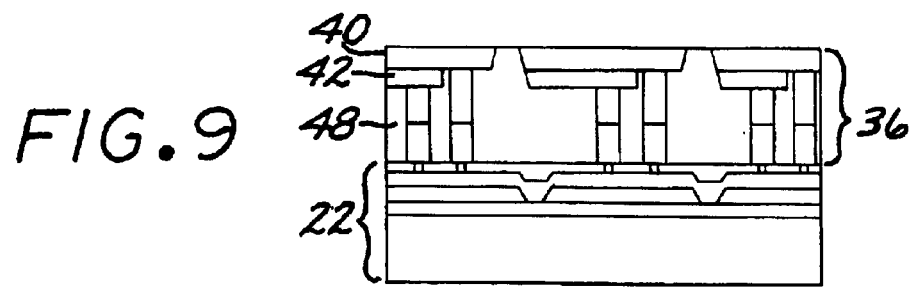

FIG. 3 depicts a preferred approach for fabricating the hybrid microelectronic array structure 20 of FIG. 1. The readout integrated circuit array 22 is provided, numeral 80. The readout integrated circuit array 22 is fabricated by standard techniques associated with each particular type of readout integrated circuit array 22. The readout integrated circuit array 22 is preferably a silicon-based microelectronic structure. The trace 34, where used, is typically made of aluminum and is deposited by vapor deposition. FIGS. 8 and 9 depict the readout integrated circuit array 22.

Figure 4:
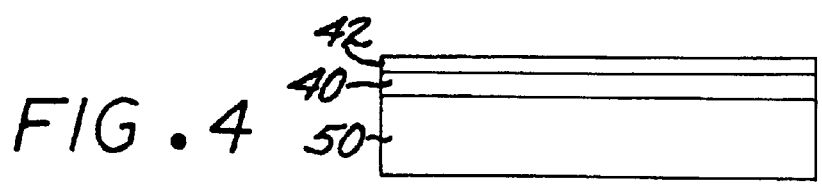
FIGS. 4–9 are schematic elevational views of the hybrid microelectronic array structure at various stages of the fabrication process.

The detector array is prepared, numeral 82. The first semiconductor region 40 is deposited onto a detector substrate 50, numeral 84. The second semiconductor region 42 is deposited onto (or implanted in) the first semiconductor region 40, numeral 84. In a preferred case, the detector substrate 50 is CdZnTe about 1 millimeter thick, the first semiconductor region 40 is n-doped HgCdTe about 15 micrometers thick, and the second semiconductor region 42 is p-doped HgCdTe about 2 micrometers thick. (The n-doped and p-doped regions may be interchanged.) The depositions are performed by any operable approach, such as preferably liquid phase epitaxy (LPE), molecular beam epitaxial (MBE) crystal growth, metalloorganic chemical vapor deposition (MOCVD). FIG. 4 depicts the resulting structure.

Figure 5:
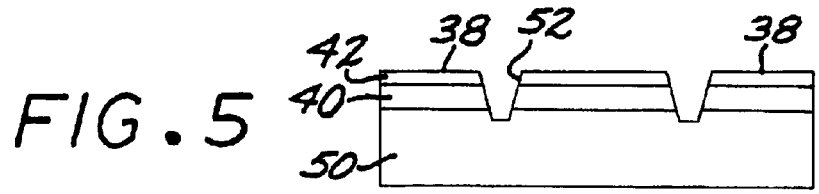
Figure 6:
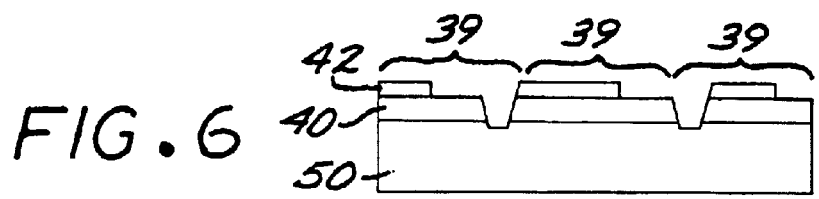

The individual detector islands 39 are electrically isolated from each other, numeral 86 and FIG. 5. Each detector island 39 may include a single detector element 38 or an array of multiple detector elements 38. Each detector island 39 includes a region of the first semiconductor region 40 overlying the detector substrate 50, and the second semiconductor region 42 overlying (or implanted in) the first semiconductor region 40. The definition of the electrically isolated detector islands 39 is preferably accomplished by forming a deep-etched trench 52 through the first semiconductor region 40 and through the second semiconductor region 42 and into the detector substrate 50. The trench 52 is preferably formed by reactive ion etching with a suitable mask.

Figure 7:
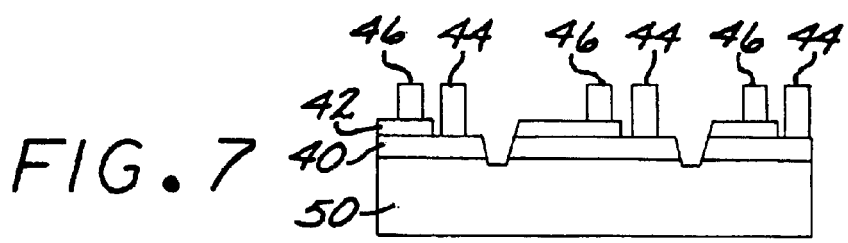

The bump interconnects 44 and 46 are formed on each detector element 38, numeral 88 and as shown in FIG. 7. In the preferred case, the interconnects 44 and 46 are bump interconnects made of indium metal. The first bump interconnect 44 is deposited on the first semiconductor region 40 and the second bump interconnect 46 is deposited on the second semiconductor region 42. The interconnects 44 and 46 are preferably formed by lithographically defining a mask and depositing the indium bumps by evaporation to a height of about 12 micrometers, which height is reduced to about 6 micrometers in subsequent bonding. This completes the preparation of the detector array 36.

The detector array 36 is joined to the readout integrated circuit array 22 by the interconnect structure 43 (the interconnects 44 and 46) to form the hybrid microelectronic array structure 20, numeral 90 and FIG. 8. This joining 90 provides the electrical and mechanical interconnection between the detector array 36 and the readout integrated circuit array 22. To accomplish the joining, the detector array 36 is inverted ("flipped") and the bump interconnects 44 and 46 are carefully aligned with the respective first and second detector interconnect locations 30 and 32 of each detector element 38 and its respective readout integrated circuit 24. The indium bumps of the interconnects 44 and 46 are then pressed to the respective detector interconnect locations 30 and 32 to accomplish cold welding. Other techniques may be used for joining, such as solder reflow, adhesive bonding, or polymer bonding.

The detector substrate 50 was left in place during the joining step 90 to provide a point of force application and to impart strength to the detector array 36. The detector substrate 50 is removed, step 92 and FIG. 9. The detector substrate 50 is removed by any operable method, but is preferably removed by diamond point turning. Other operable techniques include hand lapping, chemical-mechanical polishing, or wet chemical etching. During this step 92, some of the thickness of the common readout integrated circuit substrate 28 may also be removed to thin the entire structure for purposes to be discussed subsequently. Prior to step 92, the waxy or polymeric support material 48 may optionally be introduced between the detector array 36 and the readout integrated circuit array 22. The support material 48 is flowed between the detector array 36 and the readout integrated circuit array 22 and allowed to harden in place. The support material 48 aids in maintaining the lateral stability of the structure as the detector substrate 50 and optionally part of the common readout integrated circuit substrate 28 are removed by mechanical techniques.

FIGS. 1 and 4–9 illustrate the hybrid microelectronic array structure 20 (i.e., the readout integrated circuit array 22 and the detector array 36) as substantially planar. The present approach may also be extended so that in its final form the hybrid microelectronic array structure 20 is curved. To accomplish this curved structure, the hybrid microelectronic array structure 20 is deformed into a curved geometry, numeral 94 and FIG. 10. To accomplish the curving of the flat hybrid microelectronic array structure 20, it is preferred to apply a continuous flexible support 76 to which a back side of the common substrate 28 is affixed. FIG. 10 illustrates the positioning of the continuous flexible support 76. The continuous flexible support 76 is preferably a ductile metal film of copper or other operable metal that is adhered to the back side of the substrate 28 with a glue adhesive or other operable approach. The continuous flexible support 76 aids in holding the array of detector elements 38 in its desired shape and orientation with high precision, even after the array is deformed to a curved shape (as in FIG. 10). The continuous flexible support 76 may instead be a polymer layer of a material such as a polyimide that is spin cast onto the back side of the detector islands 39. The detector islands 39 remain physically separated from each other, but the continuous flexible support 76 provides support in subsequent operations.

The deforming step 94 is preferably accomplished with a mechanical pressure, such as a differential gas pressure. Preferably, the deforming step 94 is accomplished with a gas pressure applied to the concave side of the deforming structure or a vacuum applied to the convex side of the deforming structure. The steps 90 and 94 are preferably practiced in the described order, joining 92 followed by deforming 94. However, their order may be reversed or substeps intermixed in some instances, with the deforming of the individual components being followed by joining the deformed components, for example. To hold the deformed structure in the proper curved orientation, it may be fastened with an adhesive to a curved support 58 after it has been deformed to the proper curvature.

The deformation leaves the upper surfaces 54 of the detector elements 38 lying along a curve 56, which is typically selected as a curved focal surface of an optical system. The curve 56 may have single curvature in a single dimension, as for example a segment of a cylindrical surface, or multiple curvature, as for example a curvature in two dimensions such as a segment of a spherical surface. The curve 56 may be concave, convex, or a combination of concave and convex segments.

The segmenting of the detector array 36 into individual detector islands 39 of detector elements 38, by removing the detector substrate 50 and having non-continuous semiconductor regions 40 and 42, allows the detector array 36 to be deformed in this manner. The thinning of the common readout integrated circuit substrate 28 to a sufficient thinness (as described above as part of step 92) allows it to be readily bent elastically. To accomplish this bending, the common readout integrated circuit substrate 28 is preferably thinned to a thickness of no more than about 50 micrometers. If it is thicker, it will be too difficult to bend and may crack instead. In another approach illustrated in FIG. 10, the common ROIC substrate 28 may have trenches 74 reactive ion etched or otherwise cut into the back sides of the substrate 28 to allow the substrate 28 to bend more easily, prior to step 94.

The support 58 may be rigid, or it may instead be actively flexed by a flexure mechanism such as actuators 78 to alter the optical figure of the structure. Some examples of flexure mechanisms for the support 58 include piezoelectric devices, bimetallic devices, or bladders. That is, the focal distance or pointing direction of the light input to each of the detector elements (or emitter elements, or other supported elements) of the integrated hybrid microelectronic array structure 20 may be actively controlled by controllably flexing the support 58 to locally change the shape of the curve 56.

The segmenting of the detector array 36 into individual islands 39 of detector elements 38 has other benefits, whether or not the hybrid microelectronic array structure 20 is deformed to a curved form or is planar. Because the detector array 36 and the readout integrated circuit array 22 are made of different materials with different thermal expansion coefficients, in the conventional structure of FIG. 2 differential thermal strains and stresses are created when the structure is cooled to the cryogenic service temperature and then reheated to ambient temperature in its thermal cycles. The magnitude of the stresses is proportional to the lateral length of the detector substrate (i.e., the length parallel to the plane of the hybrid microelectronic array structure 20), so that any mechanical failures due to the buildup of stresses typically occur along the outer edge of the hybrid microelectronic array structure 20. The segmenting of the detector array 36 into individual detector islands 39 eliminates the long lateral length over which differential thermal strains and stresses can build, reducing their maximum magnitude and reducing the likelihood of mechanical failure due to this cause.

The segmenting of the detector array 36 also improves the electrical performance. Since the individual regions of the regions 40 and 42 of each of the detector elements 38 are electrically disconnected from each other, there is no electrical crosstalk between the individual detector elements 38 through the regions 40 and 42. It is often the case that an object of interest in the scene is not larger that 1–2 pixels in size. If such electrical crosstalk were to occur, stray crosstalk between adjacent detector elements 38 might cause a misinterpretation of the position of the object of interest. The isolation of the individual detector elements 38 also improves resolution through an increase in the modulation transfer function (MTF). Additionally, radiation events that affect one pixel, such as gamma rays, may affect another pixel as well in the event of electrical connections between the pixels, but such effects are eliminated in the present approach. The present hybrid microelectronic array structure 20 is therefore useful for the construction of x-ray or gamma ray detectors, or light detectors which are used in an environment where there are radiation effects.

In the structures of FIGS. 1 and 10, there is one detector element 38 in each detector island 39. In another approach illustrated in FIG. 11, there are multiple (here illustrated as two, but there may be more than two) detector elements 38 for each detector island 39.

The invention has been reduced to practice for both flat and curved configurations.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A hybrid microelectronic array structure comprising:
 a microelectronic integrated circuit array comprising an array of microelectronic integrated circuits, each of the microelectronic integrated circuits comprising a first supported-structure interconnect location and a second supported-structure interconnect location;
 a supported array comprising an array of supported islands with each supported island having at least one supported element therein, there being at least one supported element for each of the microelectronic integrated circuits, each of the supported elements comprising a first region and a second region, wherein
  the first region of each of the supported islands is physically discontinuous from the first region of each of the other supported islands, and
  the second region of each of the supported islands is physically discontinuous from the second region of each of the other supported islands; and
 a bump interconnect structure extending between each of the microelectronic integrated circuits and its respective supported element, each bump interconnect structure comprising
  a first bump interconnect extending from the first supported-structure interconnect location of each of the microelectronic integrated circuits to the first region of its respective supported element, and
  a second bump interconnect extending from the second supported-structure interconnect location of each of the microelectronic integrated circuits to the second region of its respective supported element.

2. The hybrid microelectronic array structure of claim 1, wherein the first region comprises a first semiconductor region and the second region comprises a second semiconductor region.

3. The hybrid microelectronic array structure of claim 1, wherein each microelectronic integrated circuit comprises
 an electrical interface circuit, and
 wherein each supported element comprises
 an input/output element supported on the electrical interface circuit.

4. The hybrid microelectronic array structure of claim 3, wherein
 the electrical interface circuit is a readout integrated circuit, and
 the input/output element is a detector.

5. The hybrid microelectronic array structure of claim 3, wherein the electrical interface circuit is a driver integrated circuit, and the input/output element is an emitter.

6. The hybrid microelectronic array structure of claim 1, wherein the hybrid microelectronic array structure is planar.

7. The hybrid microelectronic array structure of claim 1, wherein the hybrid microelectronic array structure is curved.

8. A hybrid microelectronic array structure comprising:

a readout integrated circuit array comprising an array of readout integrated circuits, each of the readout integrated circuits comprising a first detector interconnect location and a second detector interconnect location;

a detector array comprising an array of detector islands with each detector island having at least one detector element therein, there being at least one respective detector element for each of the readout integrated circuits, each of the detector elements comprising a first semiconductor region and a second semiconductor region, wherein the first semiconductor region of each of the detector islands is physically discontinuous from the first semiconductor region of each of the other detector islands, and the second semiconductor region of each of the detector islands is physically discontinuous from the second semiconductor region of each of the other detector islands; and a bump interconnect structure extending between each of the readout integrated circuits and its respective detector element, each bump interconnect structure comprising a first bump interconnect extending from the first detector interconnect location of each of the readout integrated circuits to the first semiconductor region of its respective detector element, and a second bump interconnect extending from the second detector interconnect location of each of the readout integrated circuits to the second semiconductor region of its respective detector element.

9. The hybrid microelectronic array structure of claim 8, wherein the first semiconductor region of each of the detector islands is an n-doped semiconductor, and the second semiconductor region of each of the detector islands is a p-doped semiconductor.

10. The hybrid microelectronic array structure of claim 8, wherein the hybrid microelectronic array structure further comprises an electrically nonconducting support material lying between the readout integrated circuit array and the detector array.

11. The hybrid microelectronic array structure of claim 8, wherein the readout integrated circuit array comprises an electrical conductor interconnecting all of the first detector interconnect locations.

12. The hybrid microelectronic array structure of claim 8, wherein the readout integrated circuit array and the detector array are each substantially planar.

13. The hybrid microelectronic array structure of claim 8, wherein the readout integrated circuit array and the detector array are each curved.

14. The hybrid microelectronic array structure of claim 8, wherein the first bump interconnect and the second bump interconnect each comprise the element indium.

15. The hybrid microelectronic array structure of claim 8, wherein the detector array type is selected from the group consisting of mercury-cadmium-telluride, indium antimonide, quantum well infrared photodetector, and extrinsic impurity band conductor material.

16. A hybrid microelectronic array structure comprising:

a readout integrated circuit array comprising an array of readout integrated circuits, each of the readout integrated circuits comprising a first detector interconnect location and a second detector interconnect location;

a detector array comprising an array of detector islands with each detector island having at least one detector element therein, there being at least one respective detector element for each of the readout integrated circuits, each of the detector elements comprising a first semiconductor region and a second semiconductor region, and wherein each of the detector islands is electrically isolated from each of the other detector islands except through the readout integrated circuit array; and an interconnect structure extending between each of the readout integrated circuits and its respective detector element, each interconnect structure comprising a first interconnect extending from the first detector interconnect location of each of the readout integrated circuits to the first semiconductor region of its respective detector element, and a second interconnect extending from the second detector interconnect location of each of the readout integrated circuits to the second semiconductor region of its respective detector element.

17. The hybrid microelectronic array structure of claim 16, wherein the first interconnect and the second interconnect of each interconnect structure are each electrically conducting bump interconnects.

18. A method of fabricating a hybrid microelectronic array structure, comprising the steps of providing a readout integrated circuit array comprising an array of readout integrated circuits, each of the readout integrated circuits comprising a first detector interconnect location and a second detector interconnect location;

preparing a detector array comprising an array of detector islands with each detector island having at least one detector element therein, there being a respective detector element for each of the readout integrated circuits, each of the detector islands comprising a first semiconductor region and a second semiconductor region, the step of providing a detector array including the steps of depositing the first semiconductor region onto a detector substrate and depositing the second semiconductor region onto the first semiconductor region, defining detector islands as electrically isolated segments, each detector island including a segment of the first semiconductor region overlying the detector substrate, and the second semiconductor region overlying the first semiconductor region, forming on each detector element a first interconnect to the first semiconductor region and a second interconnect to the second semiconductor region; and joining the detector array to the readout integrated circuit array by an interconnect structure to form the hybrid microelectronic array structure, with each readout integrated electrically interconnected to the respective one of the detector elements, the step of joining including the steps of joining each first interconnect to the respective first detector interconnect location, and joining each second interconnect to the respective second detector interconnect location.

19. The method of claim 18, wherein the first interconnect and the second interconnect of each interconnect structure are each electrically conducting bump interconnects.

20. The method of claim 18, wherein the step of defining detector islands includes the step of forming a trench through the first semiconductor region and through the second semiconductor region and into the detector substrate.

21. The method of claim 18, including an additional step, after the step of preparing and before the step of joining the detector array, of removing the detector substrate.

22. The method of claim 18, including an additional step, after the step of joining, of deforming the hybrid microelectronic array structure into a curved geometry.

23. The method of claim 18, wherein the readout integrated circuit array comprises an electrical conductor interconnecting all of the first detector interconnect locations.

* * * * *